(12) United States Patent
Byun et al.

(10) Patent No.: US 9,570,474 B2
(45) Date of Patent: Feb. 14, 2017

(54) DISPLAY DEVICE AND MANUFACTURING METHOD THEREOF (71) Applicant: Samsung Display Co., Ltd., Yongin, Gyeonggi-Do (KR)

(72) Inventors: Ho Yun Byun, Osan-si (KR); Jung Woo Park, Seoul (KR); Sun Hwa Lee, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 48 days.

(21) Appl. No.: 14/480,896

(22) Filed: Sep. 9, 2014

(65) Prior Publication Data
US 2015/0311226 A1  Oct. 29, 2015

(30) Foreign Application Priority Data

Apr. 23, 2014 (KR) ......................... 10-2014-0048918

(51) Int. Cl.
*H01L 29/786* (2006.01)
*H01L 27/12* (2006.01)

(52) U.S. Cl.
CPC ......... *H01L 27/124* (2013.01); *H01L 27/1262* (2013.01); *H01L 29/78633* (2013.01)

(58) Field of Classification Search
None
See application file for complete search history.

(56) References Cited

U.S. PATENT DOCUMENTS

| 8,536,580 B2 | 9/2013 | Kang | |
| 2003/0103176 A1* | 6/2003 | Abe | G02F 1/1362 349/113 |
| 2006/0003503 A1 | 1/2006 | Yang et al. | |
| 2012/0062448 A1* | 3/2012 | Kim | G02F 1/133377 345/55 |
| 2012/0153292 A1 | 6/2012 | Nakamura et al. | |
| 2012/0161141 A1 | 6/2012 | Jeon et al. | |
| 2012/0169217 A1 | 7/2012 | Kim et al. | |
| 2012/0281172 A1* | 11/2012 | Park | G02F 1/133707 349/123 |
| 2013/0093658 A1* | 4/2013 | Park | G02F 1/13452 345/92 |
| 2014/0104322 A1* | 4/2014 | Xu | G09G 3/3611 345/690 |

FOREIGN PATENT DOCUMENTS

| KR | 101085273 B1 | 11/2011 |
| KR | 1020130078231 A | 7/2013 |

* cited by examiner

*Primary Examiner* — Earl Taylor
*Assistant Examiner* — Samuel Park
(74) *Attorney, Agent, or Firm* — Cantor Colburn LLP (57) ABSTRACT

A display device includes a substrate including a plurality of pixel areas, a thin film transistor disposed on the substrate, a color filter and a light blocking member disposed on the thin film transistor, an insulating layer which is disposed on the color filter and the light blocking member and includes an exposed region through which the light blocking member is exposed, a pixel electrode which is disposed on the insulating layer and is connected to the thin film transistor through a contact hole, a common electrode which is spaced apart from the pixel electrode with a microcavity therebetween, a roof layer disposed on the common electrode, a liquid crystal layer which is filled in the microcavity, and an overcoat which is disposed on the roof layer and configured to seal the microcavity.

10 Claims, 8 Drawing Sheets

DISPLAY DEVICE AND MANUFACTURING METHOD THEREOF

This application claims priority to Korean Patent Application No. 10-2014-0048918 filed on Apr. 23, 2014, and all the benefits accruing therefrom under 35 U.S.C. §119, the entire contents of which are incorporated herein by reference.

BACKGROUND (a) Field

The invention relates to a display device and a manufacturing method thereof.

(b) Description of the Related Art

A liquid crystal display ("LCD") is one of the flat panel displays which is most widely used in recent years and generally includes two display panels in which a field generating electrode such as a pixel electrode and a common electrode is formed and a liquid crystal layer interposed between the display panels. A voltage is applied to the field generating electrode to generate an electric field in the liquid crystal layer, which determines an orientation of liquid crystal molecules of the liquid crystal layer therethrough and controls polarization of incident light to display an image.

Two display panels which configure the LCD may include a thin film transistor ("TFT") array panel and an opposing display panel. In the TFT array panel, a gate line which transmits a gate signal and a data line which transmits a data signal are formed to intersect each other and a TFT which is connected to the gate line and the data line and a pixel electrode which is connected to the TFT may be formed. The opposing display panel may include a light blocking member, a color filter, and a common electrode. In some cases, the light blocking member, the color filter, and the common electrode may be formed in the TFT array panel.

SUMMARY

In a conventional liquid crystal display, two substrates are necessarily used and constituent elements are disposed on the two substrates, which may result in a heavy and thick display device, large cost, and a long process time.

The invention has been made in an effort to provide a display device which is manufactured by using one substrate in order to reduce a weight, a thickness, a cost, and a process time.

Further, the invention has been made in an effort to provide a display device which discharges gas accumulated in an organic layer while improving an aperture ratio.

An exemplary embodiment of the invention provides a display device including a substrate including a plurality of pixel areas, a thin film transistor ("TFT") disposed on the substrate, a color filter and a light blocking member disposed on the TFT, an insulating layer which is disposed on the color filter and the light blocking member and includes an exposed region through which the light blocking member is exposed, a pixel electrode which is disposed on the insulating layer and is connected to the TFT through a contact hole, a common electrode which is spaced apart from the pixel electrode with a microcavity therebetween, a roof layer disposed on the common electrode, a liquid crystal layer which is filled in the microcavity, and an overcoat which is disposed on the roof layer and configured to seal the microcavity.

In an exemplary embodiment, the display device may further include an organic layer disposed on the color filter and the light blocking member and the organic layer may contact the overcoat through the exposed region of the insulating layer.

In an exemplary embodiment, the exposed region and the contact hole may be partially superimposed and the exposed region may be disposed on the light blocking member.

In an exemplary embodiment, the insulating layer may include a plurality of exposed regions.

In an exemplary embodiment, the pixel electrode may be separated from the exposed region in a plan view.

In an exemplary embodiment, the plurality of exposed regions may be symmetrically disposed in a plan view.

In an exemplary embodiment, a plurality of microcavities may be defined in a matrix in a plan view, a first valley may be defined between microcavities which are adjacent to each other in a column direction and a second valley may be defined between microcavities which are adjacent to each other in a row direction.

In an exemplary embodiment, the TFT may include a gate line and a data line, the data line may include a first data line and a second data line, and the first data line and the second data line may be disposed at both edges of the second valley.

In an exemplary embodiment, the TFT may further include a first TFT and a second TFT, the pixel electrode may include a first sub pixel electrode and a second sub pixel electrode, the first TFT may be connected to the first data line and the first sub pixel electrode, and the second TFT may be connected to the second data line and the second sub pixel electrode.

In an exemplary embodiment, a data voltage which is applied to the second data line may be lower than a data voltage which is applied to the first data line.

Another exemplary embodiment of the invention provides a manufacturing method of a display device including disposing a TFT on a substrate, disposing a color filter and a light blocking member on the TFT, disposing an insulating layer on the color filter and the light blocking member, disposing a pixel electrode which is disposed on the insulating layer and is connected to the TFT, disposing a sacrificial layer on the pixel electrode, disposing the common electrode on the sacrificial layer, disposing a roof layer on the common electrode, disposing a liquid crystal injection hole by patterning the roof layer and the common electrode so as to expose a part of the sacrificial layer, defining a microcavity between the pixel electrode and the common electrode by removing the sacrificial layer, disposing a liquid crystal layer by injecting a liquid crystal material in the microcavity through the liquid crystal injection hole, and disposing an overcoat on the roof layer to seal the microcavity, in which the insulating layer includes an exposed region through which a part of the light blocking member is exposed.

In an exemplary embodiment, the method may further include disposing an organic layer on the color filter and the light blocking member and the organic layer may contact the overcoat through the exposed region of the insulating layer.

In an exemplary embodiment, the exposed region may be disposed on the light blocking member.

In an exemplary embodiment, the insulating layer may include a plurality of exposed regions.

In an exemplary embodiment, the pixel electrode may be separated with the exposed region in a plan view.

In an exemplary embodiment, the plurality of exposed regions may be symmetrically provided in a plan view.

In an exemplary embodiment, a plurality of microcavities may be defined in a matrix, a first valley may be defined between microcavities which are adjacent to each other in a column direction and a second valley may be defined between microcavities which are adjacent to each other in a row direction.

In an exemplary embodiment, the data line may include a first data line and a second data line, and the first data line and the second data line may be disposed at both edges of the second valley.

In an exemplary embodiment, the TFT may include a first TFT and a second TFT, the pixel electrode may include a first sub pixel electrode and a second sub pixel electrode, the first TFT may be connected to the first data line and the first sub pixel electrode, and the second TFT may be connected to the second data line and the second sub pixel electrode.

In an exemplary embodiment, a data voltage which is applied to the second data line may be lower than a data voltage which is applied to the first data line.

The display device according to the exemplary embodiment of the invention may discharge gas which is accumulated in an organic layer without affecting an aperture ratio.

Further, a simple process which does not require a separate mask to form an opening through which gas is discharged may be provided.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Hereinafter, the invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

First, a display device according to an exemplary embodiment of the invention will be roughly described below with reference to FIG. 1.

Figure 1:
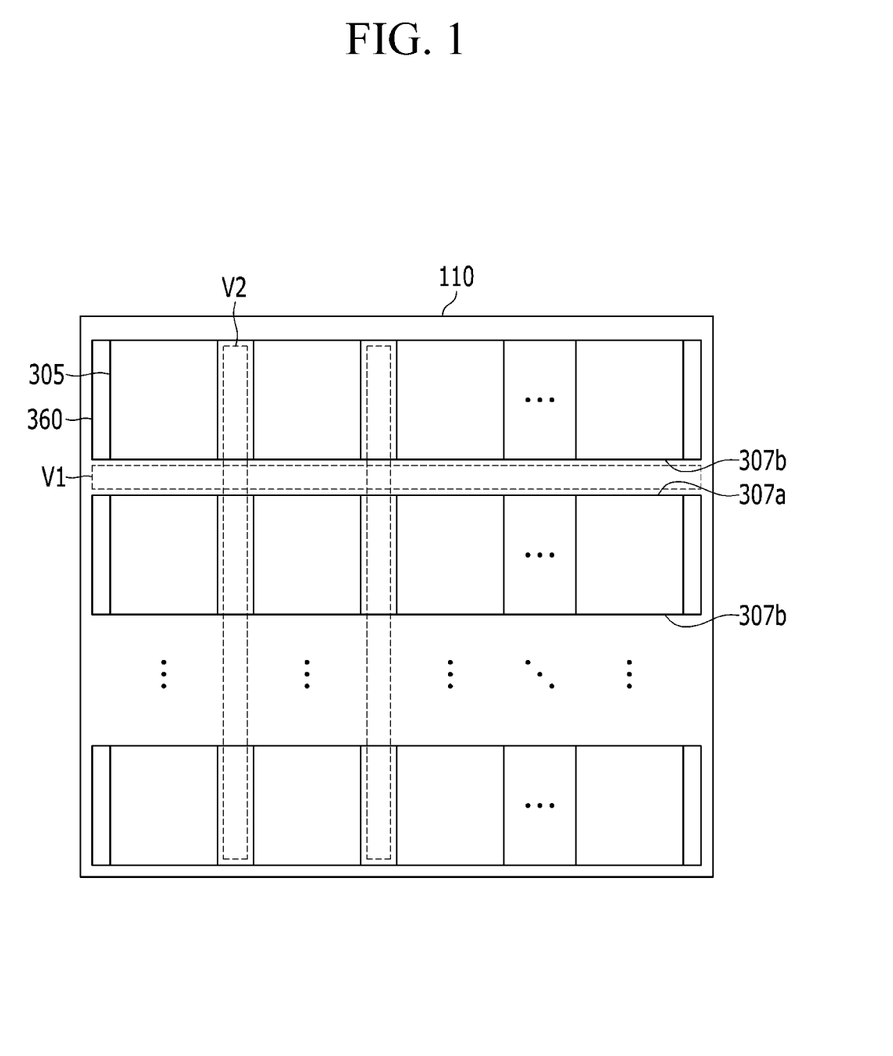
FIG. 1 is a top plan view illustrating an exemplary embodiment of a display device according to the invention.

FIG. 1 is a top plan view illustrating a display device according to an exemplary embodiment of the invention.

In an exemplary embodiment, a display device according to an exemplary embodiment of the invention includes a substrate 110 which includes a material, such as glass or plastic.

A microcavity 305 which is covered by a roof layer 360 is disposed on the substrate 110. The roof layers 360 extend in a row direction, and a plurality of microcavities 305 is defined below one roof layer 360.

The microcavities 305 may be defined in a matrix and a first valley V1 is defined between microcavities 305 which are adjacent to each other in a column direction, and a second valley V2 is defined between microcavities 305 which are adjacent to each other in a row direction.

A plurality of roof layers 360 is separated from each other, and the first valley V1 is defined between adjacent roof layers 360. Portions of the microcavity 305 which are in contact with the first valley V1 may not be covered by the roof layer 360, and may be exposed to the outside. The space exposing the portions of the microcavity 305 are referred to as injection holes 307a and 307b.

The injection holes 307a and 307b are defined at both edges of the microcavity 305. The injection holes 307a and 307b include a first injection hole 307a and a second injection hole 307b and the first injection hole 307a is provided to expose a side of a first edge of the microcavity 305 and the second injection hole 307b is provided to expose a side of a second edge of the microcavity 305. In the illustrated exemplary embodiment, the side of the first edge of the microcavity 305 is opposite to the side of the second edge thereof.

Each roof layer 360 is provided so as to be spaced apart from the substrate 110 between adjacent second valleys V2 to define the microcavity 305. That is, the roof layer 360 is formed so as to cover the other sides except for the sides of the first edge and the second edge in which the injection holes 307a and 307b are formed.

The structure of the display device according to the exemplary embodiment of the invention as described above is merely an exemplary embodiment, and numerous variations may be allowed. In other exemplary embodiments, an arrangement configuration of the microcavity 305, the first valley V1 and the second valley V2 may be modified, the plurality of roof layers 360 may be connected to each other at the first valley V1, and a part of each roof layer 360 may be provided to be spaced apart from the substrate 110 at the second valley V2 so that the adjacent microcavities 305 may be connected to each other.

Hereinafter, one pixel of a display device according to an exemplary embodiment of the invention will be schematically described below with reference to FIG. 2.

Figure 2:
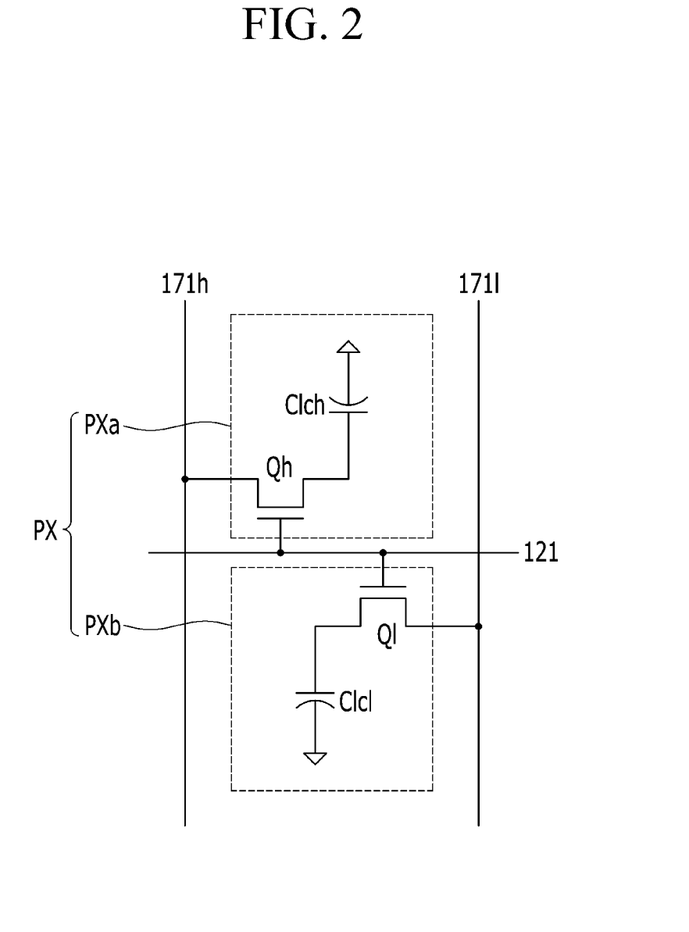
FIG. 2 is an equivalent circuit diagram of an exemplary embodiment of one pixel of a display device according to the invention.

FIG. 2 is an equivalent circuit diagram of one pixel of a display device according to an exemplary embodiment of the invention.

A display device according to an exemplary embodiment of the invention includes a plurality of signal lines 121, 171h, and 171l and pixels PX which are connected thereto. Even though not illustrated, a plurality of pixels PX may be disposed in a matrix which includes a plurality of pixel rows and a plurality of pixel columns.

Referring to FIGS. 1 and 2, each pixel PX may include a first sub pixel PXa and a second sub pixel PXb. The first sub pixel PXa and the second sub pixel PXb may be vertically disposed. A first valley V1 may be disposed between the first sub pixel PXa and the second sub pixel PXb along the pixel row direction and a second valley V2 may be disposed between the plurality of pixel columns.

The signal lines 121, 171h, and 171l include a gate line 121 which transmits a gate signal and a first data line 171h and a second data line 171l which transmit different data voltages.

A first thin film transistor ("TFT") Qh which is connected to the gate line 121 and the first data line 171h is provided in the first sub pixel PXa, and a second TFT Ql which is connected to the gate line 121 and the second data line 171l is provided in the second sub pixel PXb.

A first liquid crystal capacitor Clch which is connected to the first TFT Qh is provided in the first sub pixel PXa and a second liquid crystal capacitor Clcl which is connected to the second TFT Ql is provided in the second sub pixel PXb.

A first terminal of the first TFT Qh is connected to the gate line 121, a second terminal is connected to the first data line 171h, and a third terminal is connected to the first liquid crystal capacitor Clch.

A first terminal of the second TFT Ql is connected to the gate line 121, a second terminal is connected to the second data line 171l, and a third terminal is connected to the second liquid crystal capacitor Clcl.

In an operation of the display device according to the exemplary embodiment of the invention, when a gate-on voltage is applied to the gate line 121, the first TFT Qh and the second TFT Ql which are connected to the gate line are turned on and the first and second liquid crystal capacitors Clch and Clcl are charged with different data voltages which are transmitted through the first and second data lines 171h and 171l, respectively. In an exemplary embodiment, the data voltage which is transmitted by the second data line 171l is lower than the data voltage which is transmitted by the first data line 171h. Accordingly, the second liquid crystal capacitor Clcl is charged with a voltage which is lower than that of the first liquid crystal capacitor Clch, thereby improving a side visibility.

Hereinafter, a structure of one pixel of a display device according to an exemplary embodiment of the invention and a manufacturing method thereof will be described with reference to FIGS. 3 to 5.

Figure 3:
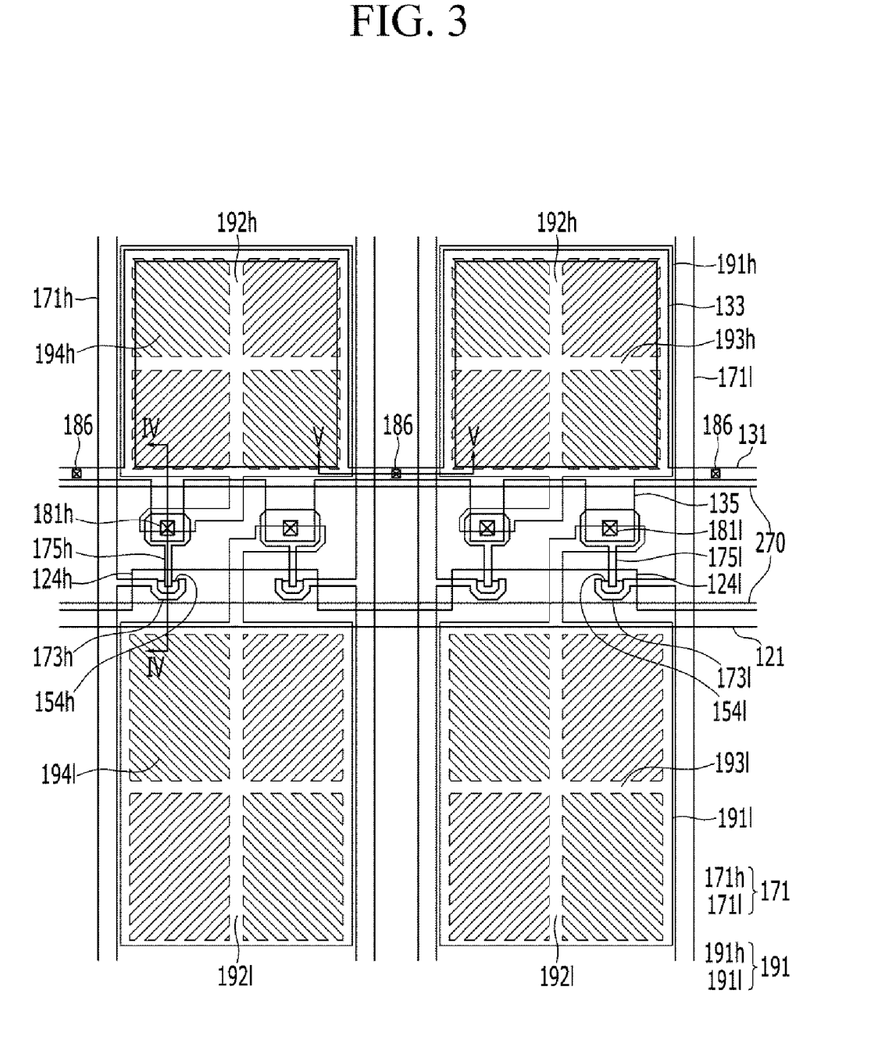
FIG. 3 is a plan view illustrating an exemplary embodiment of a part of a display device according to the invention.
Figure 4:
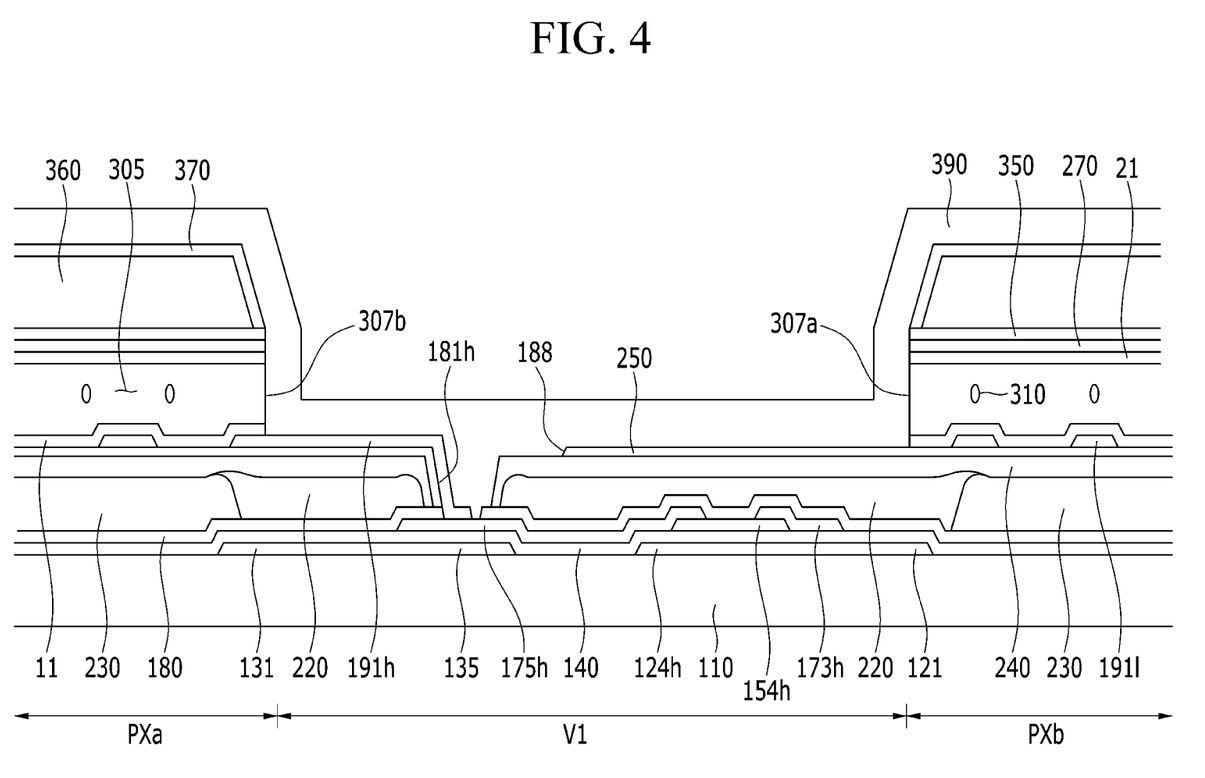
FIG. 4 is a cross-sectional view of an exemplary embodiment of a display device according to the invention taken along line IV-IV.

FIG. 3 is a plan view illustrating a part of a display device according to an exemplary embodiment of the invention, and FIG. 4 is a cross-sectional view of a display device according to an exemplary embodiment of the invention taken along line IV-IV. FIG. 5 is a cross-sectional view of a display device according to an exemplary embodiment of the invention taken along line V-V.

Figure 5:
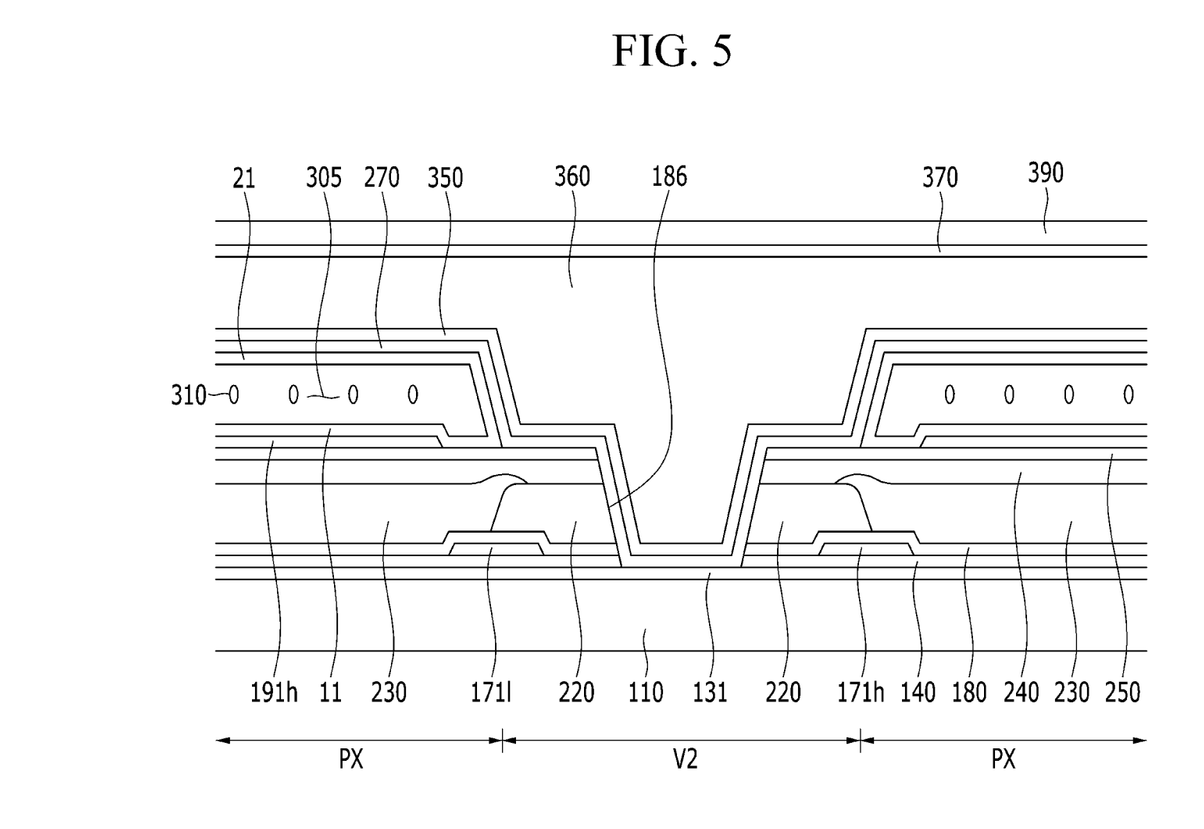
FIG. 5 is a cross-sectional view of an exemplary embodiment of a display device according to the invention taken along line V-V.

Referring to FIGS. 3 to 5, a gate line 121, a first gate electrode 124*h* and a second gate electrode 124*l* which protrude from the gate line 121 are disposed on a substrate 110.

The gate line 121 extends in a first direction and transmits a gate signal. The gate line 121 is disposed between two microcavities 305 which are adjacent in a column direction. That is, the gate line 121 is disposed in a first valley V1. The first gate electrode 124*h* and the second gate electrode 124*l* protrude to an upper side of the gate line 121 in a plan view. In an exemplary embodiment, the first gate electrode 124*h* and the second gate electrode 124*l* are connected to each other to provide one protrusion. However, the invention is not limited thereto, and a protruding shape of the first gate electrode 124*h* and the second gate electrode 124*l* may vary.

A storage electrode line 131 and storage electrodes 133 and 135 which protrude from the storage electrode line 131 may be further disposed on the substrate 110.

The storage electrode line 131 extends in a direction parallel to the gate line 121 and is spaced apart from the gate line 121. A constant voltage may be applied to the storage electrode line 131. The storage electrode 133 which protrudes above the storage electrode line 131 is provided so as to enclose an edge of the first sub pixel PXa. The storage electrode 135 which protrudes below the storage electrode line 131 is provided to be adjacent to the first gate electrode 124*h* and the second gate electrode 124*l*.

A gate insulating layer 140 is disposed on the gate line 121, the first gate electrode 124*h*, the second gate electrode 124*l*, the storage electrode line 131, and the storage electrodes 133 and 135. In an exemplary embodiment, the gate insulating layer 140 may include an inorganic insulating material such as silicon nitride (SiNx) or silicon oxide (SiOx). In exemplary embodiments, the gate insulating layer 140 may include a single layer or a multilayer.

A first semiconductor 154*h* and a second semiconductor 154*l* are disposed on the gate insulating layer 140. The first semiconductor 154*h* may be disposed on the first gate electrode 124*h* and the second semiconductor 154*l* may be disposed on the second gate electrode 124*l*. The first semiconductor 154*h* may be disposed below the first data line 171*h*, and the second semiconductor 154*l* may be disposed below the second data line. In an exemplary embodiment, the first semiconductor 154*h* and the second semiconductor 154*l* may include amorphous silicon, polycrystalline silicon, or metal oxide, for example.

Ohmic contacts (not illustrated) may be further disposed on the first semiconductor 154*h* and the second semiconductors 154*l*, respectively. In an exemplary embodiment, the ohmic contacts may include a material such as silicide or n+ hydrogenated amorphous silicon with highly doped n-type impurity.

A first data line 171*h*, a second data line 171*l*, a first source electrode 173*h*, a first drain electrode 175*h*, a second source electrode 173*l*, and a second drain electrode 175*l* are disposed on the first semiconductor 154*h*, the second semiconductor 154*l*, and the gate insulating layer 140.

The first data line 171*h* and the second data line 171*l* transmit a data signal and extend in a second direction to intersect the gate line 121 and the storage electrode line 131. The data line 171 is disposed between two microcavities 305 which are adjacent in a row direction. That is, the data line 171 is disposed in a second valley V2. The first data line 171*h* and the second data line 171*l* are disposed at both edges of the second valley V2, respectively.

The first data line 171*h* and the second data line 171*l* transmit different data voltages from each other. In an exemplary embodiment, a data voltage which is transmitted by the second data line 171*l* may be lower than a data voltage which is transmitted by the first data line 171*h*.

The first source electrode 173*h* is provided to protrude from the first data line 171*h* and disposed on first gate electrode 124*h*, and the second source electrode 173*l* is provided to protrude from the second data line 171*l* and disposed on the second gate electrode 124*l*. Each of the first drain electrode 175*h* and the second drain electrode 175*l* includes a wide end and a rod shaped end. The wide ends of the first drain electrode 175*h* and the second drain electrode 175*l* are superimposed with the storage electrode 135 which protrudes below the storage electrode line 131 in a plan view. The rod shaped ends of the first drain electrode 175*h* and the second drain electrode 175*l* are partially enclosed by the first source electrode 173*h* and the second source electrode 173*l*, respectively.

The first and second gate electrodes 124*h* and 124*l*, the first and second source electrodes 173*h* and 173*l*, and the first and second drain electrodes 175*h* and 175*l* and the first and second semiconductors 154*h* and 154*l* provide first and second TFTs Qh and Ql, respectively, and channels are respectively provided in the first semiconductor 154*h* between the first source electrode 173*h* and the first drain electrode 175*h*, and in the second semiconductor 154*l* between the second source electrode 173*l* and the second drain electrode 175*l*.

A passivation layer 180 is disposed on the first data line 171*h*, the second data line 171*l*, the first source electrode 173*h*, the first drain electrode 175*h*, and the first semiconductor 154*h* which is exposed between the first source electrode 173*h* and the first drain electrode 175*h*, and the second source electrode 173*l*, the second drain electrode 175*l*, and the second semiconductor 154*l* which is exposed between the second source electrode 173*l* and the second drain electrode 175*l*. In exemplary embodiments, the passivation layer 180 may include an organic insulating material or an inorganic insulating material, and include a single layer or a multilayer.

A color filter 230 is provided in the pixel PX on the passivation layer 180.

In an exemplary embodiment, each of the color filters 230 may represent any one of three primary colors such as red, green, and blue. However, the color filter 230 is not limited to the three primary colors of red, green, and blue but may represent cyan, magenta, yellow, and white series colors. The color filter 230 may not be provided in the first valley V1.

A light blocking member 220 is provided in a region between adjacent color filters 230. The light blocking member 220 may be provided at a border of the pixels PX and on the TFT Qh and Ql to prevent light leakage. That is, the light blocking member 220 may be provided in the first valley V1 and the second valley V2. In an exemplary embodiment, the color filter 230 and the light blocking member 220 may be superimposed with each other in some regions.

An organic layer 240 may be further disposed on the color filter 230 and the light blocking member 220. In an exemplary embodiment, the organic layer 240 may include an organic insulating material and function to planarize the color filters 230 and the light blocking member 220. In another exemplary embodiment, the organic layer 240 may be omitted.

A first insulating layer 250 may be further disposed on the organic layer 240. The first insulating layer 250 may include an inorganic insulating material and function to protect the color filter 230 and the organic layer 240.

The first insulating layer 250 may include an exposed region 188 through which a part of the organic layer 240 is exposed. The exposed region 188 is provided in a position which is adjacent to a contact hole 181h, and exposes one end of the organic layer 240 by the contact hole 181h. That is, the exposed region 188 according to an exemplary embodiment of the invention may be partially superimposed with the contact hole 181h as illustrated in FIG. 4.

The organic layer 240 which is exposed through the exposed region 188 discharges accumulative gas in the color filter 230, the light blocking member 220, and the organic layer 240 during a process such as during a manufacturing method of the display device. Therefore, the degradation of the display quality due to the accumulated gas may be prevented.

Further, in an exemplary embodiment in which the organic layer 240 is omitted, the light blocking member 220 is exposed through the exposed region 188 and discharges accumulative gas.

A first contact hole 181h which exposes the wide end of the first drain electrode 175h and a second contact hole 181l which exposes the wide end of the second drain electrode 175l are defined in the passivation layer 180, the organic layer 240, and the first insulating layer 250.

A pixel electrode 191 is disposed on the second insulating layer 250. In an exemplary embodiment, the pixel electrode 191 may include a transparent metal material such as indium tin oxide ("ITO") or indium zinc oxide ("IZO").

The pixel electrode 191 includes a first sub pixel electrode 191h and a second sub pixel electrode 191l which are separated from each other with the gate line 121 and the storage electrode line 131 therebetween. The first sub pixel electrode 191h and the second sub pixel electrode 191l are disposed in upper and lower portions of the pixel PX with respect to the gate line 121 and the storage electrode line 131 in a plan view, respectively. That is, the first sub pixel electrode 191h and the second sub pixel electrode 191l are separated to each other with the first valley V1 therebetween and the first sub pixel electrode 191h is disposed in the first sub pixel PXa and the second sub pixel electrode 191l is disposed in the second sub pixel PXb.

The first sub pixel electrode 191h is connected to the first drain electrode 175h through the first contact hole 181h, and the second sub pixel electrode 191l is connected to the second drain electrode 175l through the second contact hole 181l. Accordingly, when the first TFT Qh and the second TFT Ql are turned on, different data voltages are applied to the first sub pixel electrode 191h and the second sub pixel electrode 191l from the first drain electrode 175h and the second drain electrode 175l, respectively. An electric field may be generated between the pixel electrode 191 and the common electrode 270.

The pixel electrode 191 which includes a first sub pixel electrode 191h and a second sub pixel electrode 191l may cover a part of the contact hole 181h. That is, as illustrated in FIG. 4, the pixel electrode 191 may not be disposed on one surface of the contact hole 181h while covering the other surface of the contact hole 181h. Particularly, the exposed region 188 of the insulating layer 250 may be provided in one surface of the contact hole 181h on which the pixel electrode 191 is not disposed.

In the exposed region 188, the insulating layer 250 and the pixel electrode 191 are not disposed in one end of the organic layer 240 so that the one end of the organic layer 240 is exposed and the exposed region may be in contact with an overcoat 390 which will be described below.

In an exemplary embodiment, an overall shape of the first sub pixel electrode 191h and the second sub pixel electrode 191l in a pixel region is a quadrangle in a plan view, for example, and the first sub pixel electrode 191h and the second sub pixel electrode 191l include cross-shaped stem parts which include horizontal stem parts 193h and 193l and vertical stem parts 192h and 192l which intersect the horizontal stem parts 193h and 193l, respectively. Further, the first sub pixel electrode 191h and the second sub pixel electrode 191l include a plurality of minute branch parts 194h and 194l, respectively.

The pixel electrode 191 is divided into four sub regions by the horizontal stem parts 193h and 193l and the vertical stem parts 192h and 192l. In an exemplary embodiment, the minute branch parts 194h and 194l obliquely extend from the horizontal stem parts 193h and 193l and the vertical stem parts 192h and 192l and the extending direction may be tilted approximately 45 degrees or 135 degrees with reference to the gate line 121 or the horizontal stem parts 193h and 193l, for example. Further, the extending directions of the minute branch parts 194h and 194l in two adjacent sub regions may be perpendicular to each other.

In the illustrated exemplary embodiment, the first sub pixel electrode 191h and the second sub pixel electrode 191l may further include outer peripheral stem parts which enclose the outer peripheries of the first sub pixel PXa and the second sub pixel PXb.

An arrangement shape of the pixels, the structure of the TFT, and the shape of the pixel electrode described above are merely exemplary embodiments, and the invention is not limited thereto and numerous variations may be allowed.

The common electrode 270 is disposed on the pixel electrode 191 so as to be spaced apart from the pixel electrode 191 with a predetermined interval. A microcavity 305 is defined between the pixel electrode 191 and the common electrode 270. That is, the microcavity 305 is enclosed by the pixel electrode 191 and the common electrode 270. The common electrode 270 is provided in the row direction and on the microcavity 305 and in the second valley V2. The common electrode 270 is provided so as to cover an upper surface and a side of the microcavity 305. A width measured along the first valley V1 and an area of the microcavity 305 may vary depending on the size and a resolution of the display device.

In each pixel PX, the common electrode 270 is provided to be spaced apart from the substrate 110 so that the microcavity 305 is defined. However, the common electrode 270 is provided to be attached onto the substrate 110 in the second valley V2. In the second valley V2, the common electrode 270 is disposed directly on the second insulating layer 250. That is, a space is not defined between the second insulating layer 250 and the common electrode 270.

The storage electrode line 131 and the common electrode 270 are superimposed with each other. Insulating layers such as the gate insulating layer 140, the passivation layer 180, the light blocking member 220, and the first insulating layer 250 are provided between the storage electrode line 131 and the common electrode 270. A third contact hole 186 is defined in the insulating layers. The third contact hole 186 is defined through the gate insulating layer 140, the passivation layer 180, the light blocking member 220, and the first insulating layer 250 so as to expose at least a part of the storage electrode line 131. The third contact hole 186 is disposed in the second valley V2 and disposed between the first data line 171*h* and the second data line 171*l*. The third contact hole 186 does not expose the first data line 171*h* and the second data line 171*l*.

In the illustrated exemplary embodiment, a plurality of common electrodes 270 is provided in a row direction. Accordingly, in comparison with a case when the common electrode 270 is entirely disposed on the substrate 110 as a single surface electrode, a resistance of the common electrode 270 may be undesirably increased. In the exemplary embodiment of the invention, the common electrode 270 is connected to the storage electrode line 131 to reduce the resistance of the common electrode 270. In this case, the same common voltage may be applied to the storage electrode line 131 and the common electrode 270.

In an exemplary embodiment, the common electrode 270 may include a transparent metal material such as ITO or IZO. A constant voltage may be applied to the common electrode 270, and an electric field may be provided between the pixel electrode 191 and the common electrode 270. A first alignment layer 11 is disposed on the pixel electrode 191. The first alignment layer 11 may be disposed directly on the second insulating layer 250 which is not covered by the pixel electrode 191.

A second alignment layer 21 is disposed below the common electrode 270 so as to be opposite to the first alignment layer 11 with reference to the microcavity 305.

In an exemplary embodiment, the first alignment layer 11 and the second alignment layer 21 may be provided as vertical alignment layers and may include an alignment material such as polyamic acid, polysiloxane, or polyimide. The first and second alignment layers 11 and 21 may be connected to each other on the side wall of the edge of the microcavity 305.

A liquid crystal layer which includes liquid crystal molecules 310 is provided in the microcavity 305 which is disposed between the pixel electrode 191 and the common electrode 270. In an exemplary embodiment, the liquid crystal molecules 310 have a negative dielectric anisotropy, and may be aligned in a vertical direction to the substrate 110 when electric field is not applied. That is, vertical orientation may be generated.

The first sub pixel electrode 191*h* and the second sub pixel electrode 191*l* to which the data voltage is applied generate an electric field together with the common electrode 270 so as to determine an orientation of the liquid crystal molecules 310 disposed in the microcavity 305 between the two electrodes 191 and 270. Luminance of light which passes through the liquid crystal layer may vary depending on the orientation of the liquid crystal molecule 310 determined as described above.

A second insulating layer 350 may be further disposed on the common electrode 270. In an exemplary embodiment, the second insulating layer 350 may include an inorganic insulating material such as silicon nitride (SiNx) and silicon oxide (SiOx), and may be omitted when necessary.

A roof layer 360 is disposed on the second insulating layer 350. In an exemplary embodiment, the roof layer 360 may include an organic material. The roof layer 360 is provided in a row direction and disposed on the microcavity 305 and in the second valley V2. The roof layer 360 is provided so as to cover an upper surface and a side of the microcavity 305. The roof layer 360 is hardened by a hardening process to maintain the shape of the microcavity 305. The roof layer 360 is provided to be spaced apart from the pixel electrode 191 with the microcavity 305 therebetween.

The common electrode 270 and the roof layer 360 are provided so as to expose the side at the edge of the microcavity 305 and portions of the microcavity 305 which are not covered by the common electrode 270 and the roof layer 360 are referred to as injection holes 307*a* and 307*b*. The injection holes 307*a* and 307*b* include a first injection hole 307*a* through which a side at a first edge of the microcavity 305 is exposed and a second injection hole 307*b* through which a side of a second edge of the microcavity 305 is exposed. The first edge and the second edge are opposite to each other and, in a plan view, the first edge may be an upper edge of the microcavity 305 and the second edge may be a lower edge of the microcavity 305, for example. The injection holes 307*a* and 307*b* expose the edge side of the microcavity 305 which is adjacent to the first valley V1. The microcavity 305 is exposed through the injection holes 307*a* and 307*b* so that an aligning agent or a liquid crystal material may be injected into the microcavity 305 through the injection holes 307*a* and 307*b*.

A third insulating layer 370 may be further disposed on the roof layer 360. In an exemplary embodiment, the third insulating layer 370 may include an inorganic insulating material such as silicon nitride (SiNx) or silicon oxide (SiOx). The third insulating layer 370 may be provided so as to cover the upper surface and the side of the roof layer 360. The third insulating layer 370 functions to protect the roof layer 360 which includes an organic material and may be omitted when necessary.

An overcoat 390 is disposed on the third insulating layer 370. The overcoat 390 is provided so as to cover the injection holes 307*a* and 307*b* through which a part of the microcavity 305 is exposed to the outside. That is, the overcoat 390 may seal the microcavity 305 so as not to leak the liquid crystal molecules 310 which are provided in the microcavity 305, to the outside. The overcoat 390 is in contact with the liquid crystal molecule 310 so that the overcoat 390 is desirably including a material which does not react with the liquid crystal molecules 310. In an exemplary embodiment, the overcoat 390 may include parylene, for example.

In an exemplary embodiment, the overcoat 390 may include a multilayer such as a double layer or a triple layer. In the exemplary embodiment, the double layer includes two layers which include different materials. In the exemplary embodiment, the triple layer includes three layers, and materials of adjacent layers are different from each other. In an exemplary embodiment, the overcoat 390 may include a layer which includes an organic insulating material and a layer which includes an inorganic insulating material.

Even though not illustrated, a polarizer may be further disposed on an upper surface and a lower surface of the display device. The polarizer may include a first polarizer and a second polarizer. The first polarizer may be attached onto the lower surface of the substrate 110 and the second polarizer may be attached onto the overcoat 390.

Figure 6:
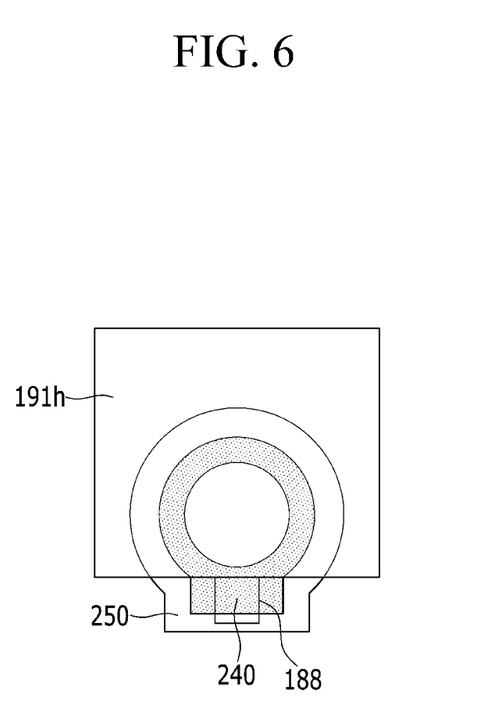
FIG. 6 is a top plan view of an exemplary embodiment of some of constituent elements including an exposed region according to the invention.

Referring to FIG. 6, in a plan view, the first insulating layer 250 includes an exposed region 188 in which the first sub pixel electrode 191*h* is not overlapped and through which a part of the organic layer 240 is exposed.

The above-described display device according to the exemplary embodiment of the invention may discharge gas which is accumulated in the organic layer 240 or/and the color filter 230 through the exposed region 188 through which a part of the organic layer 240 or the light blocking member 220 is exposed and the pixel electrode 191. This may result in reducing the stain caused by the accumulated gas.

Further, the exposed region for discharging the gas is not separately provided but is provided to be adjacent to a position where the drain electrode and the pixel electrode are connected so that the a separate aperture ratio loss or addition of a mask is not accompanied.

Hereinafter, a display device according to another exemplary embodiment of the invention will be described with reference to FIG. 7. Like constituent elements with the exemplary embodiment of the invention will not be described. Constituent elements which are disposed below the passivation layer 180 are same as those in FIGS. 3 to 6.

First, a color filter 230 is provided in each pixel PX on a passivation layer 180. In an exemplary embodiment, each color filter 230 may represent one of three primary colors of red, green, and blue. However, the color filter 230 is not limited to three primary colors of red, green and blue but may represent cyan, magenta, yellow, and white series colors. Differently from the illustrated, the color filter 230 may longitudinally extend in a column direction between the adjacent data lines 171.

A light blocking member 220 is provided in a region between adjacent color filters 230. The light blocking member 220 may be provided at a border of the pixels PX and on the TFT to prevent light leakage. The color filters 230 may be provided in the first sub pixel PXa and the second sub pixel PXb, and the light blocking member 220 may be provided between the first sub pixel PXa and the second sub pixel PXb.

An organic layer 240 may be further disposed on the color filter 230 and the light blocking member 220. In an exemplary embodiment, the organic layer 240 may include an organic insulating material and function to planarize the color filters 230 and the light blocking member 220. According to another exemplary embodiment of the invention, the organic layer 240 may be omitted.

A first insulating layer 250 may be further disposed on the organic layer 240. The first insulating layer 250 may include an inorganic insulating material and function to protect the color filter 230 and the organic layer 240.

The first insulating layer 250 may include an exposed region 188 through which a part of the organic layer 240 is exposed. The exposed region 188 may be provided to be adjacent to the contact hole 181h, and according to another exemplary embodiment of the invention, a plurality of contact holes 188 may be defined in the first insulating layer 250 as illustrated in FIG. 7. When the organic layer 240 is omitted according to another exemplary embodiment of the invention, an exposed region 188 through which the light blocking member 220 is exposed may be included.

Figure 7:
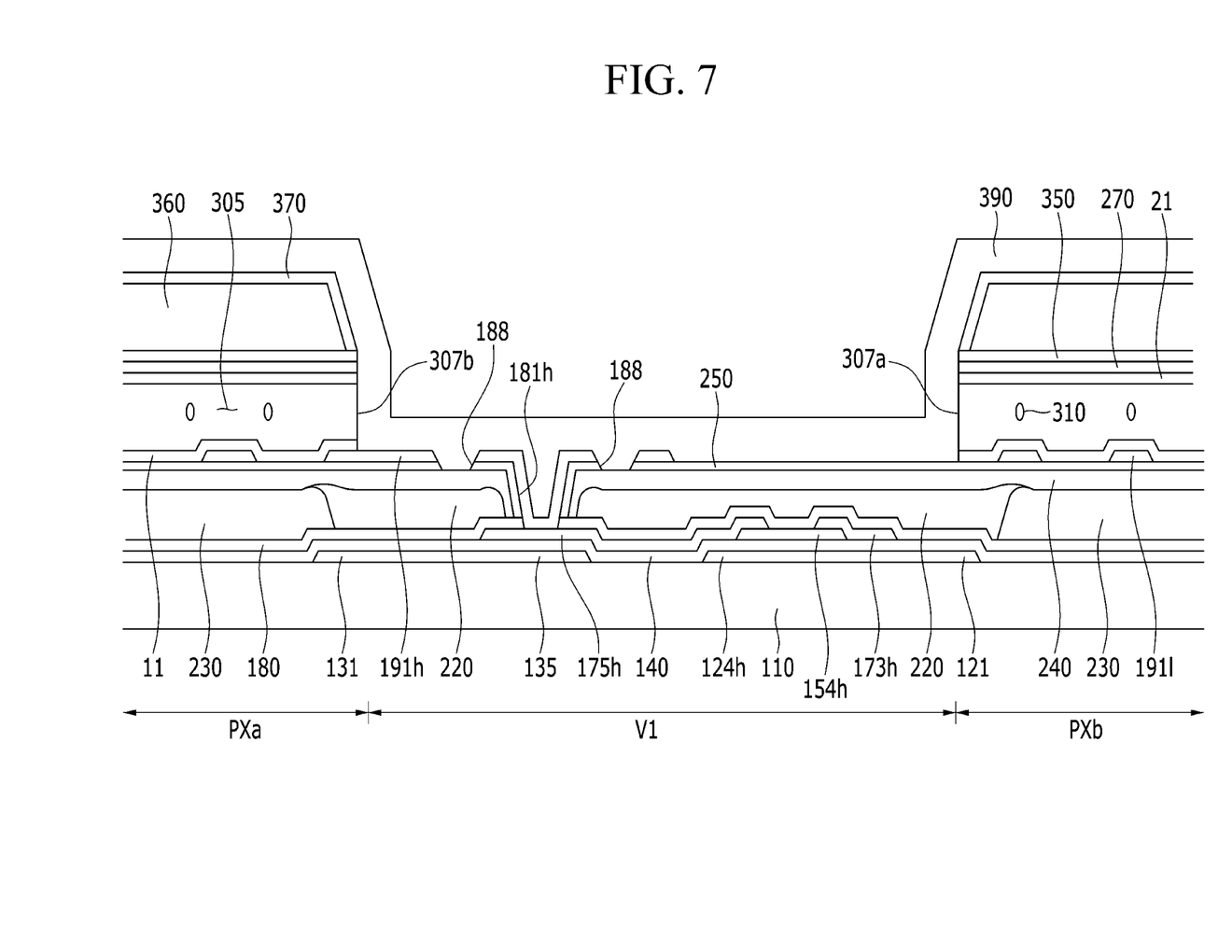
FIG. 7 is a cross-sectional view of another exemplary embodiment of a display device according to the invention taken along line IV-IV.
Figure 8:
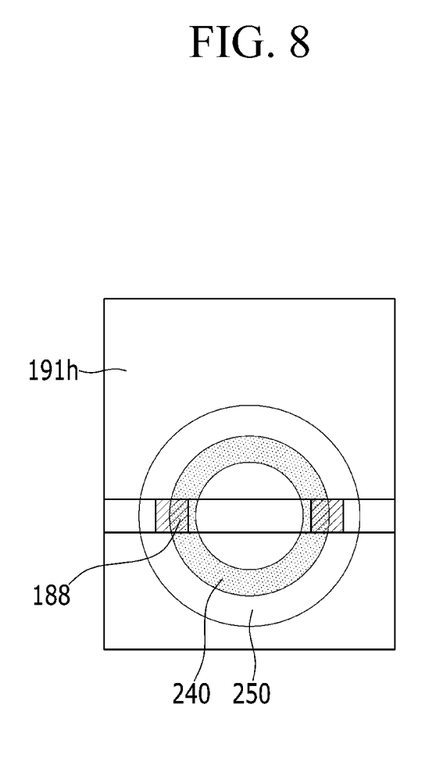
FIG. 8 is a top plan view of a part of another exemplary embodiment of a display device according to the invention.

Referring to FIGS. 7 and 8, the first insulating layer 250 includes exposed regions 188 which are disposed along a vertical direction in a plan view, but is not limited thereto and may further include an exposed region (not illustrated) which is disposed along a horizontal direction in a plan view. The position and the shape are not limited, and a plurality of exposed regions 188 may have a symmetrical shape including a left and right symmetrical shape, an up and down symmetrical shape, and a combination thereof in a plan view, for example. The exposed regions which are symmetrically disposed as described above may reduce an error caused by misalignment during the process.

A first contact hole 181h through which a wide end of the first drain electrode 175h is exposed and a second contact hole 181l (refer to FIG. 3) through which a wide end of the second drain electrode 175l (refer to FIG. 3) is exposed are provided in the passivation layer 180, the organic layer 240, and the first insulating layer 250.

A pixel electrode 191 is disposed on the first insulating layer 250. In an exemplary embodiment, the pixel electrode 191 may include a transparent metal material such as ITO or IZO.

The pixel electrode 191 includes a first sub pixel electrode 191h and a second sub pixel electrode 191l which are separated from each other with the gate line 121 and the storage electrode line 131 therebetween. The first sub pixel electrode 191h and the second sub pixel electrode 191l are disposed above and below with respect to the gate line 121 and the storage electrode line 131 in the pixel PX. That is, the first sub pixel electrode 191h and the second sub pixel electrode 191l are separated from each other with the first valley V1 therebetween, the first sub pixel electrode 191h is disposed in the first sub pixel PXa, and the second sub pixel electrode 191l is disposed in the second sub pixel PXb.

The first sub pixel electrode 191h is connected to the first drain electrode 175h through the first contact hole 181h, and the second sub pixel electrode 191l is connected to the second drain electrode 175l through the second contact hole 181l. Accordingly, when the first TFT Qh and the second TFT Q1 are turned on, different data voltages are applied to the first sub pixel electrode 191h and the second sub pixel electrode 191l from the first drain electrode 175h and the second drain electrode 175l, respectively. An electric field may be generated between the pixel electrode 191 and the common electrode 270.

The pixel electrode 191 including the first sub pixel electrode 191h and the second sub pixel electrode 191l is connected to the drain electrodes 175h and 175l through the contact holes 181h and 181l. Particularly, in step of forming a pixel electrode, the pixel electrode may be patterned so as not to be disposed in the exposed region 188, as illustrated in FIG. 7. That is, in the exposed region 188 through which the organic layer is exposed, the organic layer 240 and the overcoat 390 are in contact with each other.

The above-described display device according to the exemplary embodiment of the invention may discharge gas which is accumulated in the organic layer 240 or/and the color filter 230 through the exposed region 188 through which a part of the organic layer 240 is exposed and the pixel electrode 191. This may result in reducing the stain caused by the accumulated gas.

Further, the exposed region for discharging the gas is not separately provided but is provided to be adjacent to a position where the drain electrode and the pixel electrode are connected so that a separate aperture ratio loss or addition of a mask is not accompanied.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A display device, comprising:
a substrate including a plurality of pixel areas;
a first thin film transistor disposed on the substrate;
a color filter and a light blocking member disposed on the first thin film transistor;
an insulating layer which is disposed on the color filter and the light blocking member and includes an exposed region through which the light blocking member is exposed;

a pixel electrode which is disposed on the insulating layer and is connected to the first thin film transistor through a contact hole;
a common electrode which is spaced apart from the pixel electrode with a microcavity therebetween;
a roof layer disposed on the common electrode;
a liquid crystal layer which is filled in the microcavity; and
an overcoat which is disposed on the roof layer and configured to seal the microcavity, and
wherein the overcoat contacts a lateral surface of the insulating layer.

2. The display device of claim 1, further comprising:
an organic layer disposed on the color filter and the light blocking member,
wherein the organic layer contacts the overcoat through the exposed region of the insulating layer.

3. The display device of claim 2, wherein:
the exposed region and the contact hole are partially superimposed and the exposed region is disposed on the light blocking member.

4. The display device of claim 2, wherein:
the insulating layer includes a plurality of exposed regions.

5. The display device of claim 2, wherein:
the pixel electrode is separated from the exposed region in a plan view.

6. The display device of claim 4, wherein:
the plurality of exposed regions is symmetrically disposed in a plan view.

7. The display device of claim 1, wherein:
a plurality of microcavities are defined in a matrix in a plan view,
a first valley is defined between microcavities of the plurality of microcavities which are adjacent to each other in a column direction, and
a second valley is defined between microcavities of the plurality of microcavities which are adjacent to each other in a row direction.

8. The display device of claim 7, further comprising a second thin film transistor,
wherein:
the first thin film transistor includes a first data line and the second thin film transistor includes a second data line, and
the first data line and the second data line are disposed at both edges of the second valley.

9. The display device of claim 8, wherein:
the pixel electrode includes a first sub pixel electrode and a second sub pixel electrode,
the first thin film transistor is connected to the first sub pixel electrode, and
the second thin film transistor is connected to the second sub pixel electrode.

10. The display device of claim 9, further comprising data voltages respectively applied to the first and second data lines, wherein:
a data voltage which is applied to the second data line is lower than a data voltage which is applied to the first data line.

* * * * *